United States Patent [19]

Metro

[11] 3,842,211

[45] Oct. 15, 1974

[54] MONOLITHIC STEREO DECODER

[75] Inventor: John G. Metro, Liverpool, N.Y.

[73] Assignee: General Electric Company, Syracuse, N.Y.

[22] Filed: Nov. 16, 1972

[21] Appl. No.: 307,066

Related U.S. Application Data

[62] Division of Ser. No. 122,769, March 10, 1971.

[52] U.S. Cl. .............................. 179/15 BT, 331/176

[51] Int. Cl. .............................................. H04h 5/00

[58] Field of Search ........ 179/15 BT; 329/122, 123; 331/25, 109, 176, 113

[56] References Cited

UNITED STATES PATENTS

| | | | |
|---|---|---|---|
| 3,264,579 | 8/1966 | Marcus | 331/176 |
| 3,377,567 | 4/1968 | Pontius | 331/176 |
| 3,388,344 | 6/1968 | West | 331/176 |
| 3,400,337 | 9/1968 | Sherlin | 331/176 |
| 3,526,853 | 9/1970 | Vittoz | 331/176 |
| 3,573,506 | 2/1972 | Morris | 331/176 |
| 3,584,154 | 6/1971 | McShan | 179/15 BT |
| 3,644,757 | 2/1972 | Rezek | 331/176 |
| 3,714,595 | 3/1971 | Denenberg | 179/15 BT |

OTHER PUBLICATIONS

Inductorless FM Stereo Mpx. Circuit Using a PPL, Denenberg, IEEE Transactions on Broadcasting, 11/70.

*Primary Examiner*—Kathleen H. Claffy
*Assistant Examiner*—Thomas D'Amico
*Attorney, Agent, or Firm*—Marvin A. Goldenberg; W. J. Shanley, Jr.; Frank L. Neuhauser

[57] ABSTRACT

A monolithic integrated circuit decoder for deriving stereophonically related audio frequency signals from a composite signal includes an input circuit for generating DC voltage-balanced signals including the composite signal for balanced, linear operation of the decoder. The decoder further includes a phase-locked loop having a temperature compensated current controlled oscillator and a frequency dividing dual rank flip-flop of simplified structure producing a staircase waveform on alternate half-cycles. The decoder also includes an audio mute circuit for muting the output of the decoder between stations.

3 Claims, 3 Drawing Figures

PATENTED OCT 1 5 1974

3,842,211

SHEET 2 OF 2

MONOLITHIC STEREO DECODER

This is a continuation, X division, of application Ser. No. 122,769, filed Mar. 10, 1971.

FIELD OF THE INVENTION

This invention relates to a circuit for decoding stereophonically related audio frequency signals. More specifically, it relates to an inductorless circuit in monolithic integrated circuit form for decoding the stereophonic signals.

BACKGROUND OF THE INVENTION

As the procedures are perfected for fabricating circuits in miniature form such as by processing a single block of semiconductor material to produce a monolithic integrated circuit, circuit designs as well as the selection and arrangement of circuit components have had to change to best accommodate the improved miniaturization process. The present invention is concerned with a stereophonic signal decoder circuit and the selection and arrangement of circuit components and the design of such a circuit to be suitable for fabrication in monolithic integrated circuit form.

In addition to being suitable for monolithic fabrication, for which the elimination of all tuned circuits having magnetic elements is desirable, the decoder of the present invention provides accurate processing of the stereophonic information and inherent circuit reliability to compensate for the difficulty to repair the decoder in its final integrated circuit form.

SUMMARY OF THE INVENTION

A stereo decoder circuit derives two stereophonically related audio frequency signals from a composite signal containing frequency components in the form of the sidebands of a difference combination of the two signals amplitude modulated on a suppressed carrier wave, a sum combination of the two signals lying in a frequency band lower in frequency than the sidebands and separated therefrom by a frequency gap, and a pilot signal at a frequency equal to one half that of the suppressed carrier and lying in the frequency gap. In accordance with the standard for stereo broadcasting in the United States, the suppressed carrier frequency is 38 KHz and the pilot is 19 KHz. One of the stereophonically related signals is the right channel band of audio information and the other is the left channel band of audio information.

The stereophonic information contained in the composite signal is decoded by reconstituting the suppressed subcarrier to employ it to demodulate the difference combination (L − R) sidebands which are then combined with the L + R signal to derive the desired L and R outputs. In present day FM stereo multiplex decoders the regeneration of the suppressed carrier is accomplished by a series of tuned amplifier circuits to separate the pilot signal from the composite signal and to generate the 38 KHz subcarrier therefrom. In accordance with one object of the present invention, that of eliminating tuned circuits having magnetic elements to make possible the fabrication of the decoder in integrated circuit form, a phase-locked loop circuit is employed to derive the 38 KHz subcarrier. The phase-locked loop comprises a detector to which the composite signal is applied, a controlled oscillator nominally adjusted to 38 KHz and responsive to the output of the detector, and a frequency divider to divide the 38 KHz down to 19 KHz. The output of the frequency divider is applied to the detector forming a closed loop so that the 19 KHz pilot signal is selected from the composite and compared with the feedback signal to control the frequency of the oscillator. One of the features of this invention is an improved frequency divider which takes the form of a master-slave or dual rank flip-flop having simplified structure by providing a staircase waveform (instead of a square wave) output on alternate half-cycles.

The decoder circuit of this invention also includes a level detecting circuit to which the composite signal is applied to determine when the level or amplitude of this signal is suitable for processing. The level detecting circuit includes means for driving an indicator light to show that a suitable stereophonic signal is present for processing and provides a signal to control the application of the regenerated subcarrier to the demodulator circuit of the decoder so that processing of the composite signal in the stereophonic mode takes place only in the presence of a strong enough signal for satisfactory output performance.

There are thus three circuits in the decoder to which the composite signal is applied, the phase-locked loop detector, the level detector, and the demodulator. Since each of these circuits includes a differential amplifier for balanced processing of the composite signal, it is another feature of the invention in furtherance of the object of obtaining simplified circuit structure, to provide a two channel DC voltage-balanced signal for the pair of inputs of each differential amplifier. The DC voltage-balanced signal is provided by an input circuit which combines a direct voltage with the composite signal and then forms two channels, one containing the composite signal and the DC voltage and the other channel containing only the DC voltage so that each channel contains the same DC voltage level for balanced linear signal processing.

Since the reconstituted subcarrier is generated locally by the decoder, there is the need to insure that the local oscillator can be locked to the desired frequency by the incoming pilot signal over the temperature range of operating conditions. Locking the oscillator of the phase-locked loop to the frequency of the subcarrier is complicated by the affect temperature change has on the operating characteristics of the transistors of the oscillator. There is thus provided as part of the invention an oscillator having a single bias current source that is modified to render the temperature coefficient of the oscillator to be substantially zero.

Another feature of the invention is an audio mute circuit responsive to a signal indicating whether the radio receiver or tuner is tuned to a station or between stations to mute the audio output of the decoder when the radio receiver is between stations. Muting is effected by supplying a DC voltage (substantially equal to the DC voltage provided by the input circuit of the decoder) to the demodulator in place of the combined composite signal and DC voltage supplied by the input circit.

BRIEF DESCRIPTION OF THE DRAWINGS

Other features and objects of the present invention as well as a more complete understanding may be obtained from the following detailed description of an exemplary embodiment of the invention made with reference to the drawings, in which.

DETAILED DESCRIPTION

Figure 1:
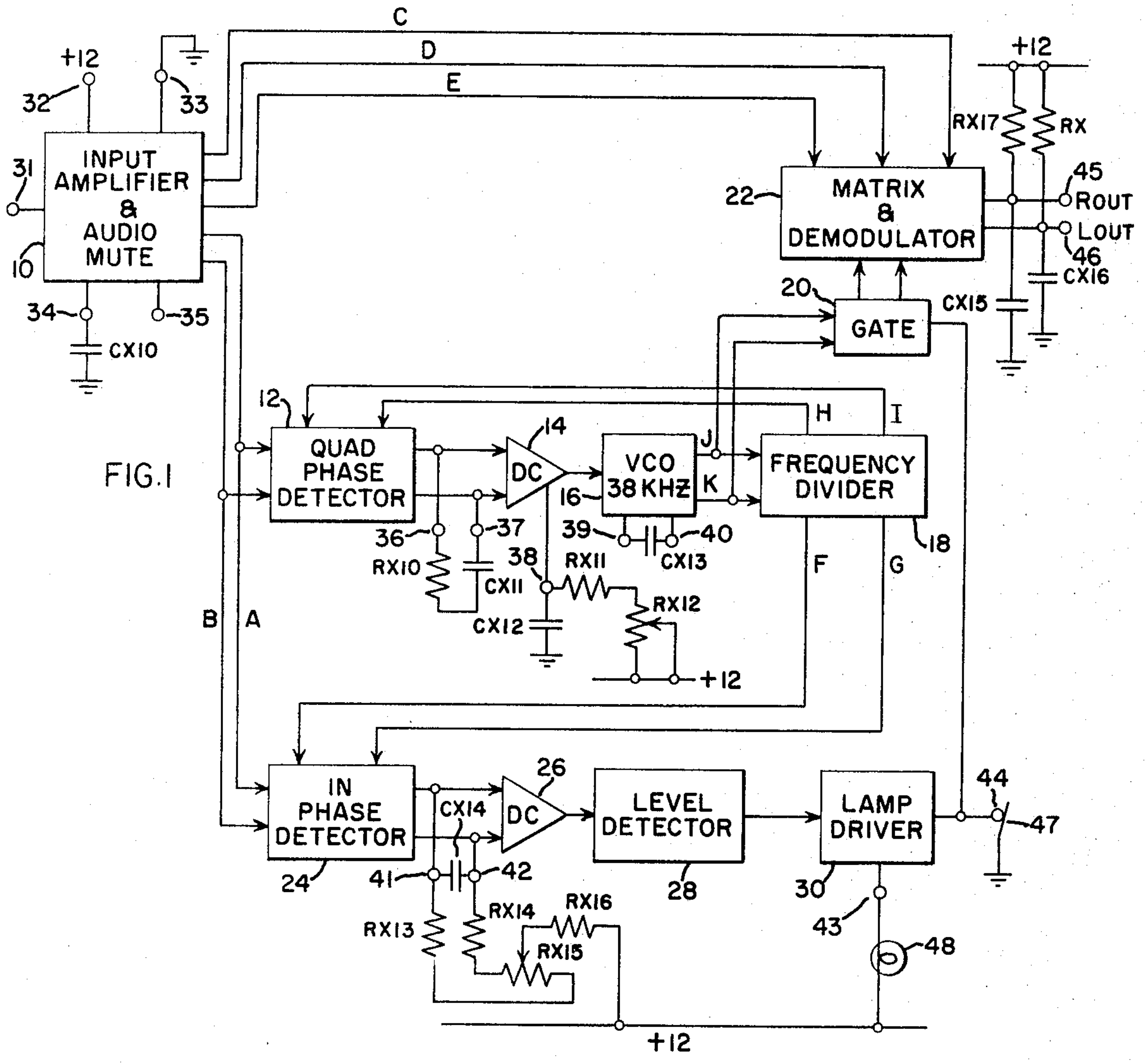
FIG. 1 is a block diagram of the decoder circuit in accordance with the invention.

Referring now to the drawings, wherein like reference numerals refer to like parts throughout, there is shown in the block diagram of FIG. 1 a decoder circuit suitable for fabrication in monolithic integrated circuit form for deriving stereophonically related audio frequency signals from a composite signal (as previously defined). This decoder circuit includes a phase-locked loop including a quadrature phase detector 12, a DC amplifier 14, a current controlled oscillator 16 and a frequency divider 18. The primary function of the phase-locked loop is to reconstitute the suppressed subcarrier so that the stereophonic signals can be derived from the composite signal under the control of the subcarrier signal. The composite signal, as will be described below, is applied to the quadrature phase detector 12 as well as a feedback signal from the divide by two frequency divider 18. Since the current controlled oscillator is adjusted to nominally produce a 38 KHz signal, the feedback signal H-I applied to the quadrature phase detector 12 is approximately 19 KHz. The quadrature phase detector acts as a mixer or multiplier to obtain frequency components of the product of the composite signal input A-B and the H-I feedback signal. Because of the balanced operation of the detector, substantially all of the components of the two input signals (A-B and H-I) are eliminated and only the product of the two signals appears at the output.

To limit the output frequency of phase detector 12 and to help to establish the lock-in range of the phase-locked loop, there is provided on external pins 36 and 37 external resistor RX10 and capacitor CX11 (X identifying an external component throughout) to provide a low pass filter for the phase detector. The cutoff frequency of the filter is quite low so that the only signal capable of being passed is the difference frequency of the 19 KHz pilot and the approximately 19 KHz feedback signal. The detector is thus rendered responsive to only the pilot signal component of the composite.

The beat frequency difference between the pilot signal and feedback signal H-I is applied to the current controlled oscillator 16 by DC amplifier 14 in the form of a changing control signal to the oscillator to change its frequency and in turn the feedback frequency applied to the phase detector. When the feedback frequency is equal to the frequency of the pilot signal, the output from the phase detector is a direct current having a value sufficient to maintain the oscillator at the frequency of the suppressed carrier.

FIG. 1 shows that the DC amplifier 14 is provided with external components CX12, RX11 and adjustable resistor RX12. These external components in conjunction with the RX10, CX11 filter define the bandpass response of the phase-locked loop and establish the bandwidth or lock-in range for the loop. The remaining external component in the phase-locked loop, capacitor CX13, determines the frequency of oscillator 16.

Figure 3:
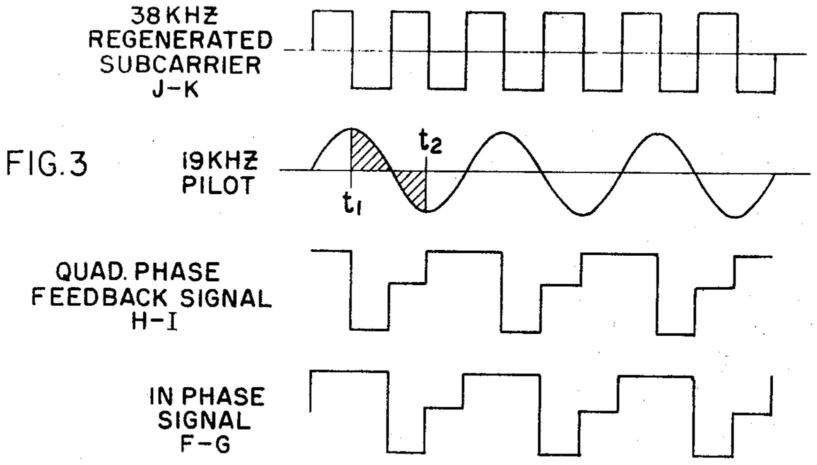
FIG. 3 shows different waveforms appearing in the decoder circuit.

Frequency divider 18 also generates an output F–G that is applied to in-phase detector 24 along with the composite signal A–B. The relation between the H-I signal applied to phase detector 12 and the F–G signal applied to phase detector 24 is shown in FIG. 3. These two signals, the third and fourth waveforms shown in this figure, are notable in their alternate half-cycle staircase waveform and the 90 degrees phase displacement therebetween. In FIG. 3, the 38 KHz regenerated subcarrier J–K is shown at the top and the second waveform is that of the 19 KHz pilot. In-phase detector 24 compares the 19 KHz pilot with the in-phase 19 KHz signal F–G from frequency divider 18 so that a direct voltage indicative of the amplitude of the pilot signal is applied to level detector 28 by DC amplifier 26 (when the loop is locked). The external resistors RX13 and RX14 at the output of phase detector 24 determine the gain of the detector and thereby establish in conjunction with level detector 28 the pilot level necessary to activate lamp driver 30 and to initiate stereo processing of the composite signal. External resistor RX15 serves as a trim adjustment of resistors RX13 and RX14 and capacitor CX14 filters out any AC component resulting from the multiplication of the two signals.

The output of the in-plate detector is amplified by DC amplifier 26 and compared with the threshold voltage level established by level detector 28 so that when the level of the pilot signal exceeds this threshold level, lamp driver 30 is activated to light stereo indicator lamp 48 and to provide a control signal to gate 20.

Lamp driver 30 is shown having a stereo indicator light 48 connected to an external pin 43 and also a stereo killer switch 47 connected to pin 44 at the output of this invention. Switch 47 enables a listener to override a "gate open" signal from the lamp driver. By closing switch 47, the composite signal will be processed by the matrix and demodulator circuit 22 in the monaural mode. Gate 20, as noted from the foregoing, couples the output of the oscillator to the matrix and demodulator 22 under the control of the level detector output from lamp driver 30.

Figure 2:
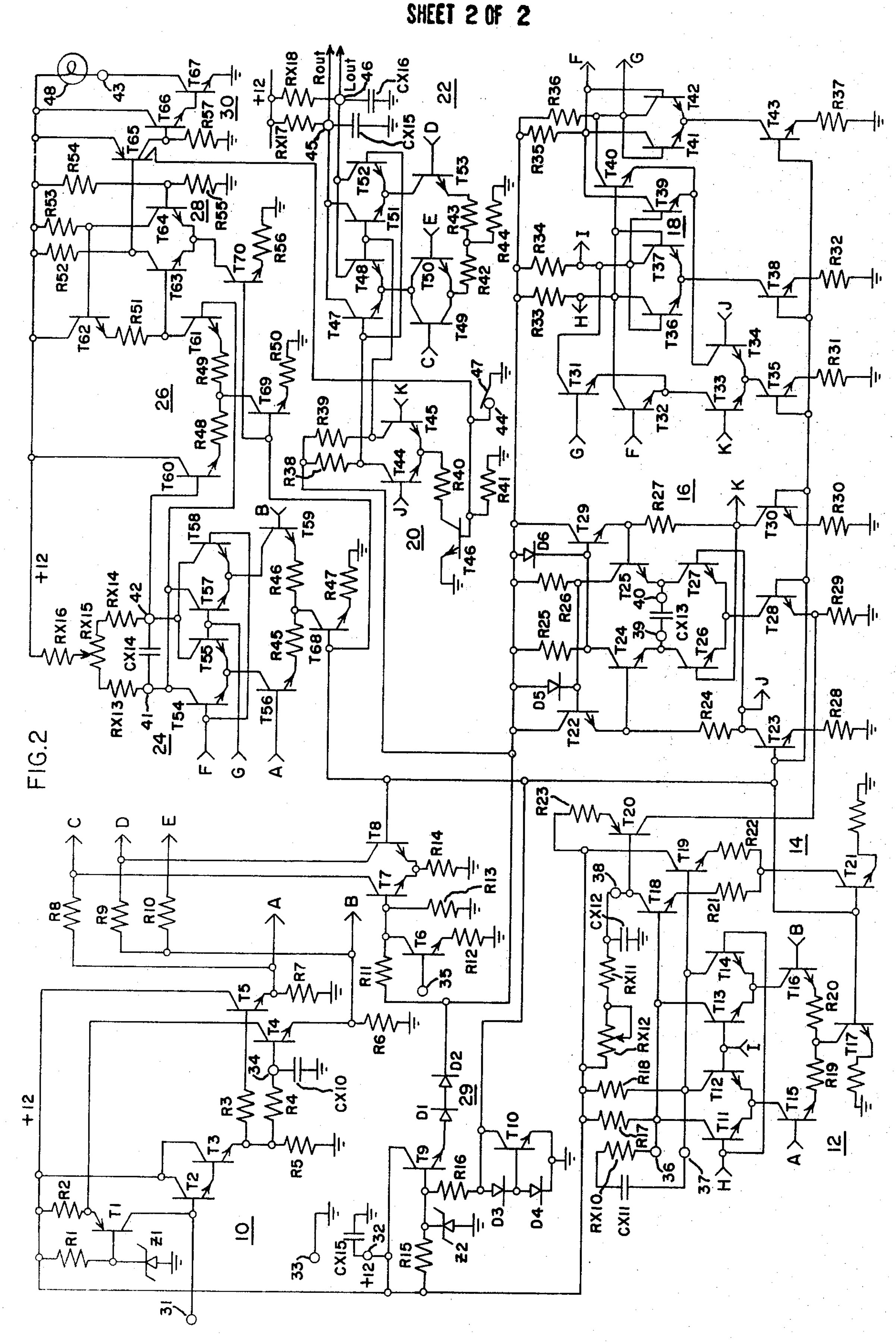
FIG. 2 is a detailed circuit diagram of the decoder.

The matrix and demodulator 22 responds to the 38 KHz reconstituted carrier from gate 20 and to the DC voltage-balanced composite signal from input amplifier 10 to derive the left and right stereo signals. A matrix and demodulator, and specifically the one shown in FIG. 2, is one example of many circuits suitable for processing stereo signals. The denomination, matrix and demodulator, while descriptive of the particular circuit selected, is intended to include the variety of circuits available for deriving stereo signals such as time sampling circuits.

The output of the decoder appears at pins 45 and 46 of the demodulator where there is connected a deemphasis network comprising external resistors RX17, RX18 and capacitors CX15, CX16 for deemphasizing the high frequency components of the audio output signals.

The remaining block of the diagram of FIG. 1 is the input amplifier and audio mute block 10. The input amplifier receives the composite signal on pin 31, a supply voltage on pin 32, an electrical common on pin 33 and obtains filtering by capacitor CX10 connected to pin 34 to eliminate the composite signal from certain supply channels as hereinafter explained. On pin 35, connected to the audio mute circuit, there is received an input signal indicative of whether the radio tuner, of which the stereo decoder forms a part, is tuned to a station or is between stations. The input amplifier is shown coupled to the quadrature phase detector 12, the in-phase detector 24 and, as modified by the audio mute circuit, to the matrix and demodulator 22.

Referring now to FIG. 2, input amplifier 10 is shown to comprise a high current gain transistor amplifier made up of transistors T2 and T3 connected in a Darlington emitter follower configuration. Resistor R5 is the common emitter resistor for the two transistors. The composite signal (previously defined) is applied to this amplifier at pin 31. Also connected to the base lead input of transistor T2 is PNP transistor T1, which forms a feedback loop with transistors T2, T3 and T4 to set the DC output level of this amplifier in conjunction with resistor R1 and Zener diode Z1 and to provide a high input impedance at pin 31. The high input impedance, to enable the decoder to be used with any radio of tuner, is attributed to the high gain of the T2, T3 amplifier and to the high output impedance of transistor T1.

The combined signal, i.e., the composite signal and the DC voltage appears at the emitter of amplifier T2, T3 and is there split into two channels by resistors R3 and R4. The combined signal appears on the R3 channel while external capacitor CX10 filters out the composite signal from the R4 channel so that a two channel DC voltage-balanced input signal A–B is provided for the decoder by emitter follower amplifiers T5 and T4. This output from amplifier 10 is DC voltage-balanced in the respect that the DC voltage level on each of the channels is substantially equal. Such a balanced signal is required by the quadrature phase detector 12, the in-phase detector 24 and the matrix and demodulator 22. Outputs A and B are duplicated as C and D with an extra output E for the purposes of the audio mute circuit, as described below.

FIG. 2, in addition to the details of the circuit shown in the block diagram of FIG. 1, shows a bias circuit 29 for providing the necessary voltage levels for the decoder. The bias circuit can be connected to a supply voltage such as a +12 volts power supply (filtered by capacitor CX15) at pin 32 and to ground at pin 33. A +6 volts supply is generated by transistor T9 in conjunction with resistor R15, Zener diode Z2 and diodes D1 and D2. The bias circuit 29 also provides, by means of resistor R16, diodes D3 and D4 and transistor T10, a voltage source to control the bias current levels of the circuits throughout the decoder. The specific function of this latter circuit will be described in greater detail below.

The phase-locked loop of the decoder is shown at the bottom of FIG. 2. The quadrature phase detector 12 of the loop contains a differential amplifier made up of transistors T15 and T16 responsive to the dual channel input signal A–B from input amplifier 10 and biased by a single current applied by bias transistor T17. The quadrature phase detector also receives feedback signal H-I from frequency divider 18. Feedback signal H–I is shown being applied to the base leads of transistors T11 and T14 (H) and to the base leads of transistors T12 and T13 (I). These transistors form a doublethrow, double-pole switch for sampling the signal A–B at a rate determined by the feedback frequency. The T11, T12, T13, T14 switch is controlled by the feedback signal to alternately apply the output of T15 and T16 to either load resistor R17 or R18. A low-pass filter comprised of external capacitor CX11 and resistor RX10 is connected across the output of this phase detector at external pins 36 and 37. The output of the detector is applied to the base leads of transistors T18 and T19 of differential DC amplifier 14. External components RX12, RX11 and CX12 of this amplifier adjust the effect that the signal from the quadrature phase detector will have on oscillator 16. Transistor T20 provides a voltage to current conversion of the amplified signal from amplifier 14 and couples this current to control oscillator 16. Since adjustable resistor RX12 is in the base circuit of T20, it provides adjustment of the control current and therefore the free running frequency of the oscillator.

A better understanding of the operation of quadrature phase detector 12 may be obtained by reference to FIG. 3. This figure shows from top to bottom, the 38 KHz regenerated subcarrier output J–K from oscillator 16, the 19 KHz pilot from the composite signal, the feedback signal H-I from frequency divider 18 in phase quadrature to the pilot and the frequency divider signal F–G in phase with the pilot. Attention is drawn to the pilot waveform and particularly the shaded portions between time $t_1$ and $t_2$. It is noted that if the pilot is sampled during this period, the average DC output is zero since the shaded areas are equal. Since a DC output of one polarity will cause the oscillator to change its frequency or phase in one direction and an output of the opposite polarity brings about change in the other direction, the nature of the phase-locked loop is to seek stability so that when the signal H–I is sufficiently close to a quadrature phase relation to the pilot to provide that DC output to the oscillator to maintain it at a constant frequency, the loop is locked.

Oscillator 16 is an emitter-coupled astable multivibrator modified so that the timing voltage across external capacitor CX13 is a function of the single current applied to the circuit by transistor T28. This current flows through diode D5 and load resistor R26, transistor T25, capacitor CX13, and transistor T26; and alternately through diode D6 and load resistor R25, transistor T24, capacitor CX13 and transistor T27. Transistors T26 and T27 constitute a differential amplifier responsive at the base lead of each to the load current of the other. Transistor T26 is connected at its base lead to load resistor R25 by transistor 29. Transistor T22 connects the base lead of transistor T27 to load resistor R26. It is noted that multivibrator transistors T24 and T25 are also cross coupled by means of transistors T22 and T29. Diodes D5 and D6 establishing the same base voltage for transistors T22 and T29, the matched cut-in voltage of T24 and T25, the single timing capacitor CX13 and the single bias current from transistor T28 all contribute to provide a symmetrical square wave output for the oscillator, necessary for maximum left and right channel separation at the output of the decoder and for proper functioning of the demodulator.

Since the frequency of the oscillator can be expressed by the equation.

$$F = I_B - I_C/4\ V_c C$$

where $I_B$ is the current through R29 when the collector current of transistor T20 is zero, $I_C$ is the collector current of transistor T20, so that $I_B - I_C$ is the collector current of transistor T28. C is the value of the timing capacitor CX13 and $V_C$ is the cut-in voltage of multivibrator transistors T24 and T25. Since $V_C$ has a negative temperature coefficient and it is desired that the frequency F remain constant with temperature, this negative temperature coefficient is compensated for by providing a negative temperature coefficient for $I_B - I_C$ to result in a near zero temperature coefficient for the oscillator. The negative temperature coefficient for $I_B - I_C$ is provided by the forward biased diodes D3 and D4 in bias circuit 29 which are driven by a constant current by means of resistor R16 and transistor T10. One diode voltage drop provided by diodes D3, D4 is taken up by transistor T28 and the other diode drop appears across resistor R29 to generate the bias current for the oscillator.

In addition to bias transistor T28 of the controlled oscillator, transistors T17, T21, T23, T28, T30, T38, T43, T68, T69, and T70 are all supplied from the bias circuit 29 and provide a bias current for their respective circuits.

The frequency dividing means 18 of this invention is shown in detail in FIG. 2 to consist of a dual rank or master-slave flip-flop capable of producing two outputs at a frequency half that of the clock input and 90 degrees out of phase from each other. This dual rank flip-flop comprises main flip-flop transistors T36, T37 for the master flip-flop and T41, T42 for the slave flip-flop. Gate transistors T31, T32 are provided for the master flip-flop and are responsive to the F–G output from the slave flip-flop. Gate transistors T39 and T40 for the slave flip-flop are responsive to the H-I output from the master flip-flop. The two flip-flops are controlled by clock transistors T33 and T34 which respond to the J-K 38 KHz signal from oscillator 16. It is noted that on each half cycle of the 38 KHz clock either transistor T33 or transistor T34 is conducting. The current conducted by either of these transistors is controlled by bias transistor T35.

If transistor T33 is conducting and the input to transistor T32 is positive so that it is conducting, current will pass through R33, T32, T33 and T35. By the fact that transistor T32 is conducting, the voltage at point H is low and therefore the input to the base of transistor T37 is low so that this transistor is off. The voltage at point I, at the collector of transistor T37, is therefore high and transistor T36 connected thereto at its base lead is conducting. Thus, a second current is drawn through resistor R33 by transistors T36 and T38. By observing the feedback signal H–I in FIG. 3 this condition is represented by the voltage at point H being at its lowest point which occurs during the second half cycle of the 38 HKz clock shown in FIG. 3. During the next half cycle of the clock, when it becomes positive, transistor T34 is now conducting and transistor T33 is off. Thus, load current is no longer conducted by the gate transistor T33 from point H but only by the main transistor T36. This is shown by the next portion of the half cycle of the quadrature phase output signal H–I in FIG. 3 to cause the voltage at point H to rise. It is noted that the in phase signal F–G at this time is at its most negative value thus following by 90 degrees the transition of the H-I feedback signal. On the next half cycle of the clock, at its transition from positive to negative, transistor T33 is again turned on but this time transistor T31 is conducting due to the F-G output still being in the substantially negative state. The conduction of T31 draws current through resistor R34, transistor T31, transistor T33 and T35 so that point I now becomes low and transistor T36 turns off. Transistor T37 turns on with the rise of voltage at H and will stay on until both transistors T33 and T32 are again conducting.

Some observations may be made concerning dual rank flip-flop 18. First of all, the designation master or slave is arbitrary since the two flip-flops are identical. Secondly, and most important, because it was recognized that the phase discriminators 12 and 24 could respond to the staircase wave function that is present on alternate half cycles of the output of the flip-flops rather than requiring a square wave output, it was possible for this simplified frequency divider to be utilized.

The level detecting circuit, including in phase detector 24, DC amplifier 26, level detector 28 and lamp driver 30, is shown in the upper right of FIG. 2. In phase detector 24 is substantially identical in operation to the quadrature phase detector 12 with the exception that the DC output level at pins 41 and 42 is merely an indication of the level of the pilot due to the in phase viewing of the pilot. This output level signal, regulated in amplitude by external resistors RX13 and RX14 (which are balanced by variable resistor RX15) and filtered by capacitor CX14, is applied to the DC amplifier 26. The single-ended output of this amplifier at the collector of transistor T61 is applied to the base of transistor T63 of the differential amplifier T63, T64 of level detector 28. Transistor T64 has a fixed voltage level applied to its base by resistor divider R54, R55. Thus, if the level of the pilot (a function of the actual level of the pilot signal in the composite and also the gain of phase detector 24, as determined by the ratio between external resistors RX13 and RX14 and resistors R45 and R46) is higher than the threshold determined by the resistor divider network, transistor T63 turns on turning off transistor T64 by the regenerative action of the common emitter bias source provided by transistor T70. The turning off of transistor T64 causes the voltage at its collector to rise. This increased voltage level is applied in regenerative feedback fashion to the base of transistor T63 to lock-on this device. A hysteresis is thus provided for the detector circuit by transistor T63 since the pilot level must drop in excess of the amount of the voltage differential applied to the base of T63 by T62 before T63 can turn off.

The conduction of transistor T63 causes the base of PNP dual collector transistor T65 to be pulled down to cause this transistor to turn on. The current conducted by the collectors of transistor T65 develops sufficient voltage across R57 to turn on transistors T66 and T67 to drive the stereo indicator light 48 and develops sufficient voltage across resistor R41 to bias transistor T46 in gate 20 on. The conduction of transistor T46 in gate 20 permits the passage of emitter current for transistors T44 and T45 so that the 38 KHz square wave J–K applied to the base leads of these transistors is transmitted to the matrix and demodulator circuit 22.

The matrix and demodulator circuit 22 responds to the combined composite signal and direct voltage C from input amplifier 10 at the base of transistor T49 and to direct voltage input D at the base of transistor T53. The 38 KHz oscillator signal is applied to transistors T47, T48, T51 and T52 which act as a double-pole, double-throw switch to demodulate the L-R sidebands of the composite signal and to combine this demodulated signal with the L+R signal. The matrix resistors R42, R43 and R44 are set to ensure that the demodulating action of the 38 KHz signal produces an L–R signal at baseband that is of equal voltage level to the L+R signal appearing at the outputs for maximum separation of the left and right signals.

If the level of the pilot signal is insufficient for satisfactory stereophonic signal output, the lamp driver circuit 30 will not be turned on by level detector 28 to pass a stereo enabling signal to gate 20 and the 38 KHz oscillator signal will not reach matrix and demodulation circuit 22. In the absence of the 38 KHz switching signal, circuit 22 will operate in the monaural mode. This is occasioned in the following manner. When transistor T46 does not conduct, neither do transistors T44 and T45 so the collectors of these devices are at the supply voltage level and all of the demodulator transistors T47, T48, T51 and T52 are turned on so that there is no demodulation and the composite signal is applied to the output deemphasis network RX17, RX18, CX15 and CX16 at output terminals 45, 46. The deemphasis network, provided to deemphasize the L and R signals, also acts as a low pass filter to eliminate substantially of the composite signal except the baseband R+L portion. The same filtering action eliminates the storecasting signal, the 38 KHz and the 19 KHz components when operation is in the stereo mode.

When the tuner, of which the stereo decoder forms a part, is not turned to a station, it will pick up interstation noise. It is desired that this noise is not applied to the speakers and accordingly, the stereo decoder includes an audio mute circuit. The audio mute circuit is associated with the input amplifier 10 of the decoder and also with the matrix and demodulator 22.

It was noted above that the two channel DC voltagebalanced input signal C–D applied to the matrix and demodulator 22 is identical to input signal A–B in the absence of an audio mute signal. When the tuner is not tuned to a station the voltage applied to pin 35 (by means not shown) is low, transistor T6 is nonconducting and transistor T7 is biased on by voltage divider network R11, R13 providing a more positive voltage to this transistor than that provided to the base of transistor T8. With transistor T7 conducting, the voltage level at output C is less than the voltage level on the additional channel E, provided for the purposes of audio muting and having a direct voltage equal to that of channel D. Channel E is applied to alternate input transistor T50 added to the matrix and demodulator circuit across transistor T49 for the purpose of audio muting. Transistor T50 will conduct instead of transistor T49 when transistor T7 conducts to lower the voltage of channel C below that of channel E.

The substitution of channel E for channel C by the audio mute circuit accomplishes two things. First, the composite signal is not applied to the matrix and demodulator output circuit so no audio signals appear at output pins 45, 46. Secondly, channel C, containing the composite signal plus a selected DC voltage level, is replaced by channel E having the same DC voltage level so that there is no audible indication of this change as would occur if only input channel C was eliminated.

This invention has been described with reference to a particular embodiment. This embodiment is set forth as but one example of structure suitable for carrying out the functions of the invention and it will be obvious to those skilled in the art that many changes can be made without departing from the spirit of the invention. For example, whether components are external to the integrated circuit or part thereof is somewhat determined by the capability of the process of integrated circuit fabrication for incorporating such components within the integrated circuit. Thus, as integrated circuit fabrication procedures improve, fewer external components will be necessary. Also, as has been mentioned previously, the matrix and demodulator is but one embodiment of a circuit for deriving the stereophonically related output signals. Any circuit capable of this function and suitable to the integrated circuit fabrication process could be substituted without altering the inventive concepts herein set forth. It is accordingly expected that the foregoing description shall be taken by way of example and not in limitation of the scope of the invention which is intended to be defined only by the appended claims.

What is claimed is:

1. In a monolithic integrated circuit for deriving first and second stereophonically related audio frequency signals from a composite signal including frequency components in the form of the sidebands of a difference combination of said first and second audio frequency signals amplitude modulated on a suppressed carrier wave of given frequency, a sum combination of said first and second audio frequency signals lying in a frequency band lower in frequency than said sidebands and separated therefrom by a frequency gap, and a pilot signal at a frequency equal to one half that of said suppressed carrier wave and which lies in said frequency gap, a phase-locked loop for reconstituting said suppressed carrier comprising, a controlled oscillator adjusted to oscillate nominally at the frequency of said suppressed carrier, frequency dividing means responsive to the signal generated by said oscillator for producing an output signal nominally at the frequency of said pilot signal and having a staircase waveform and a square waveform during alternate half cycles, and detector means responsive to the pilot signal of said composite signal and to the frequency divided output of said controlled oscillator and coupled to said oscillator to lock the frequency thereof to said given frequency, said frequency dividing means comprising flip-flop means having main switch means, gate switch means, clock switch means responsive to the signal generated by said oscillator, and current source means for said main switch means and said gate switch means, said main switch means having first and second output current paths, each output current path conducting gate switch means current and main switch means current for one half cycle of the oscillator signal and main switch means current alone for the other half cycle during alternate conduction periods of said main switch means, all under the control of said clock switch means.

2. In a monolithic integrated circuit for deriving first and second stereophonically related audio frequency signals from a composite signal including frequency components in the form of the sidebands of a difference combination of said first and second audio frequency signals amplitude modulated on a suppressed carrier wave of given frequency, a sum combination of said first and second audio frequency signals lying in a frequency band lower in frequency than said sidebands and separated therefrom by a frequency gap, and a pilot signal at a frequency equal to one half that of said suppressed carrier wave and which lies in said frequency gap, a phase-locked loop for reconstituting said suppressed carrier comprising, a controlled semiconductor oscillator adjusted to oscillate nominally at the frequency of said suppressed carrier, said frequency being a function of the ratio of a control current I supplied to said oscillator from a current source, to a voltage V of said oscillator, the value of said voltage V tending to change as function of temperature, frequency divider means responsive to the signal generated by said oscillator, and detector means responsive to the composite signal and to the frequency divided output of said controlled oscillator and coupled to said oscillator to lock the frequency thereof to said given frequency, said current source including semiconductor means for effecting changes in the value of said control current I as a function of temperature so as to compensate for temperature related changes in said voltage V, and thereby regulate the frequency of said oscillator.

3. A monolithic integrated circuit as recited in claim 1 further including level detecting means responsive to the pilot signal of said composite signal to determine the suitability of the level of said composite signal and means for deriving said first and second stereophonically related audio frequency signals from said composite signal in response to an indication from said level detecting means that a suitable signal is present and under the control of said reconstituted suppressed carrier, and wherein said frequency dividing means produces a second output signal nominally at the frequency of said pilot signal, in phase quadrature with the other output signal of said frequency dividing means and having a staircase waveform and a square waveform during alternate half cycles, said second output signal being applied to said level detecting means to control the operation thereof.

* * * * *